US006747586B2

(12) United States Patent
Okamoto

(10) Patent No.: US 6,747,586 B2
(45) Date of Patent: Jun. 8, 2004

(54) SIGNAL PROCESSING DEVICE HAVING A D/A CONVERTER WITH A REDUCED CIRCUIT AREA WITHOUT SACRIFICING THE RESOLUTION

(75) Inventor: Kouji Okamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/341,428

(22) Filed: Jan. 14, 2003

(65) Prior Publication Data
US 2003/0189505 A1 Oct. 9, 2003

(30) Foreign Application Priority Data
Apr. 5, 2002 (JP) .................................... 2002-104269

(51) Int. Cl.[7] ........................... H03M 3/00; H03M 1/66
(52) U.S. Cl. ...................................... 341/144; 341/143
(58) Field of Search ........................... 341/61, 118, 141, 341/143, 144, 152

(56) References Cited

U.S. PATENT DOCUMENTS 5,489,903 A * 2/1996 Wilson et al. .............. 341/144
5,574,455 A * 11/1996 Hori et al. .................. 341/144
6,226,502 B1 * 5/2001 Chung ........................ 455/118
6,229,464 B1 * 5/2001 McNeely ..................... 341/118
6,304,200 B1 * 10/2001 Masuda ...................... 341/144
6,411,232 B1 * 6/2002 Miller et al. ................ 341/120
6,424,282 B1 * 7/2002 Maenza ...................... 341/144
6,535,153 B1 * 3/2003 Zierhofer .................... 341/143

FOREIGN PATENT DOCUMENTS

JP  07-66726   3/1995
JP  09-22566   1/1997

* cited by examiner

Primary Examiner—Jean Bruner Jeanglaude
(74) Attorney, Agent, or Firm—McDermott, Will & Emery

(57) ABSTRACT

A D/A converter in an analog-digital mixed loop is realized with a reduced circuit area without sacrificing the resolution. A bit modulation section modulates an m-bit digital control signal, which is output from a digital section, into an n-bit (n<m) intermediate digital signal whose temporal average precision is substantially m bits. A D/A conversion section converts the intermediate digital signal into an intermediate analog signal having a range corresponding to m bits. Then, by the smoothing operation through an analog filter, the intermediate analog signal is output as an analog control signal that has an m-bit precision as that of the original signal. In this way, it is possible to reduce the bit width for the internal operation and thus to reduce the circuit area without sacrificing the resolution of a D/A converter.

19 Claims, 13 Drawing Sheets

SIGNAL PROCESSING DEVICE HAVING A D/A CONVERTER WITH A REDUCED CIRCUIT AREA WITHOUT SACRIFICING THE RESOLUTION

BACKGROUND OF THE INVENTION

The present invention relates to a signal processing device and a D/A converter, and more particularly to a D/A conversion technique used in a signal processing device including an analog-digital mixed loop having a digital section and an analog section for converging a loop output to a target value through the analog-digital mixed loop.

FIG. 14 illustrates a configuration of a reproduction signal processing device as an example of a signal processing device having an analog-digital mixed loop. A pickup 1 reads out information recorded on a recording medium 3 such as an optical disk or a magnetic disk that is rotated by a spindle motor 2, and outputs the information as a reproduction signal to a variable-gain amplifier 4. The amplitude of the reproduction signal is adjusted by the variable-gain amplifier 4 to be in conformity with the input dynamic range of an A/D converter 6. After the noise of the signal in high-frequency band is eliminated through an analog filter 5, the signal is quantized by the A/D converter 6 into a digital signal DT0.

The digital signal DT0 is input to a digital signal processing block 7 and a PLL block 8, which extract recorded data DT1 and a clock CK1, respectively, from the digital signal DT0. Moreover, the digital signal DT0 is fed back to the analog section through an offset adjustment block 9 and a gain adjustment block 10. The offset adjustment block 9 produces an analog control signal based on the digital signal DT0 so as to correct the offset of the A/D converter 6. The gain adjustment block 10 produces an analog control signal based on the digital signal DT0 so as to correct the gain factor of the variable-gain amplifier 4.

There is an analog-digital mixed loop also in the PLL block 8. FIG. 15 illustrates an internal configuration of the PLL block 8. While the PLL block 8 is in the frequency detection mode, a frequency comparator 82 calculates the frequency error between a fed-back signal (a signal obtained by dividing the frequency of the output clock CK1 by a frequency divider 89) and the digital signal DT0. A loop filter 84 produces a digital control signal DT11 based on the error amount. Then, the digital control signal DT11 is converted into an analog control signal DT12 by a D/A converter 86. A VCO (Voltage Controlled Oscillator) 88 outputs a corrected clock CK1 based on the analog control signal DT12.

A current-cell type D/A converter, which is capable of operating at a high speed and has a high resolution, is used as the D/A converter 86 in the PLL block 8.

FIG. 16 illustrates an internal configuration of the current-cell type 8-bit D/A converter 86. The received 8-bit digital control signal DT11 is stored in a register section 861 in synchronization with the system clock. Then, the lower four bits are used for turning ON/OFF a group of weighted current sources 863, while the upper four bits are decoded into 15-bit data by a decoder section 862. The 15-bit data is used for turning ON/OFF a number of current cells ($16I_0$) in a current cell matrix 864 based on the value of the upper four bits.

Assume a case where "00101100" is input, as the digital control signal DT11, to the D/A converter 86. In this case, since the lower four bits are "1100", the output of the group of weighted current sources 863 is $8I_0+4I_0=12I_0$. Moreover, since the upper four bits are "0010", two current cells of the current cell matrix 864 are turned ON to give an output of $16I_0*2=32I_0$. The output from the group of weighted current sources 863 and that from the current cell matrix 864 are added together by an output section 865, which outputs $12I_0+32I_0=44I_0$ as the analog control signal DT12.

In the PLL block 8, the output frequency range of the VCO 88, which is to be controlled, is quite wide. Therefore, a D/A converter having a high resolution is used as each of D/A converters 85 and 86. However, a D/A converter having a high resolution takes, as its input, the digital control signal DT11 having a large bit width, whereby the bit width for the internal operation becomes large. Thus, such D/A converters, particularly those of a current-cell type, lead to an increase in the circuit area and make it difficult to reduce the cost.

Moreover, not only the PLL block 8, but in general, a signal processing device having an analog-digital mixed loop requires a D/A converter or a similar element. If the signal processing device requires a D/A converter or a similar element having a high resolution, there will be problems as those described above.

SUMMARY OF THE INVENTION

The present invention has been made in view of the above, and has an object to provide a D/A converter in an analog-digital mixed loop with a reduced circuit area without sacrificing the resolution. It is also an object of the present invention to provide a signal processing device including such a D/A converter.

In order to achieve the objects set forth above, the present invention provides a signal processing device including a loop having a digital section for processing a digital signal and an analog section for processing an analog signal for converging a loop output to a target value through the loop, the signal processing device including a D/A converter for converting an m-bit (m is a positive integer) digital control signal received from the digital section into an analog control signal having substantially the same precision as that of the m-bit digital control signal so as to output the analog control signal to the analog section. The D/A converter includes: a bit modulation section for modulating the m-bit digital control signal into an n-bit (n is a positive integer: n<m) intermediate digital signal whose temporal average precision is substantially the same as the precision of the m-bit digital control signal; a D/A conversion section for converting the n-bit intermediate digital signal into an intermediate analog signal having a range corresponding to m bits; and an analog filter for smoothing the intermediate analog signal so as to output the smoothed signal as the analog control signal.

According to the present invention, the m-bit digital control signal is modulated by the bit modulation section into the intermediate digital signal while reducing the bit width from m bits to n bits. The temporal average precision of the intermediate digital signal is substantially the same as the precision of the m-bit digital control signal. Then, the intermediate digital signal is converted by the D/A conversion section into the intermediate analog signal having a range corresponding to m bits. As the intermediate digital signal, the intermediate analog signal also has a substantially m-bit precision. Finally, the intermediate analog signal is smoothed through the analog filter so as to be output as the analog control signal having substantially the same precision as the m-bit digital control signal. Therefore, according to the present invention, it is possible to reduce the bit width used for the operation inside the D/A converter, thereby reducing the circuit area of the signal processing device as a whole without sacrificing the resolution of the D/A converter.

It is preferred that the bit modulation section produces, from lower (m−n) bit/bits of the m-bit digital control signal, a 1-bit modulation bit whose temporal average precision is substantially the same as an (m−n)-bit precision so as to produce the n-bit intermediate digital signal by adding together upper n bit/bits of the m-bit digital control signal and the modulation bit.

In order to achieve the objects set forth above, the present invention also provides a signal processing device including a loop having a digital section for processing a digital signal and an analog section for processing an analog signal for converging a loop output to a target value through the loop, the signal processing device including a D/A converter for converting an m-bit (m is a positive integer) digital control signal received from the digital section into an analog control signal having substantially the same precision as that of the m-bit digital control signal so as to output the analog control signal to the analog section, the D/A converter including: a bit modulation section for producing, from lower (m−n) bit/bits (n is a positive integer: n<m) of the m-bit digital control signal, a 1-bit modulation bit whose temporal average precision is substantially the same as an (m−n)-bit precision; a D/A conversion section for converting upper n bit/bits of the m-bit digital control signal into a first intermediate analog signal having a range corresponding to m bits; a power supply section, which is capable of outputting an analog value corresponding to one bit in the D/A conversion section, and which outputs a second intermediate analog signal in response to the modulation bit as a switching signal; an adder for adding together the first and second intermediate analog signals; and an analog filter for smoothing an output from the adder so as to output the smoothed signal as the analog control signal.

According to the present invention, the bit modulation section produces the one-bit modulation bit from the lower (m−n) bit/bits of the m-bit digital control signal. The temporal average precision of the modulation bit is substantially (m−n) bit/bits. The modulation bit is used in the power supply section as the switching signal, whereby the second intermediate analog signal is output. The precision of the second intermediate analog signal is also substantially (m−n) bit/bits, as that of the modulation bit. The second analog signal is added together with the first intermediate analog signal, which is obtained by conversion through the D/A conversion section, to produce a signal whose precision is substantially m bits. Finally, the output from the adder is smoothed through the analog filter, and the smoothed signal is output as the analog control signal having substantially the same precision as that of the m-bit digital control signal. Therefore, according to the present invention, it is possible to reduce the bit width used for the operation inside the D/A converter, thereby reducing the circuit area of the signal processing device as a whole without sacrificing the resolution of the D/A converter.

It is preferred that the bit modulation section produces the modulation bit in synchronization with a second operating clock that is faster than a first operating clock, the first operating clock being an operating clock of the D/A conversion section.

In this way, the modulation bit is produced in synchronization with the second operating clock being faster than the first operating clock, which is the operating clock of the D/A conversion section. Thus, the input signal to the analog filter is smoothed more quickly, and the loop output of the signal processing device can be converged to the target value more quickly.

It is preferred that the bit modulation section produces, as the modulation bit, a fixed value at one logical level if a value of the lower (m−n) bit/bits of the m-bit digital control signal is equal to a predetermined reference value, whereas the bit modulation section produces, as the modulation bit, a fluctuating value in which a number of bits corresponding to the value of the lower (m−n) bit/bits of the m-bit digital control signal are at the other logical level for consecutive $2^{(m-n)}$ occurrences of the modulation bit if the value of the lower (m−n) bit/bits of the m-bit digital control signal is not equal to the predetermined reference value.

Thus, if the value of the lower (m−n) bit/bits of the digital control signal is equal to the predetermined reference value (e.g., "0"), the modulation bit is a fixed value at one logical level (e.g., "0"). If the value of the lower (m−n) bit/bits of the digital control signal is not equal to the predetermined reference value, the modulation bit is a fluctuating value in which a number of bits corresponding to the value of the lower (m−n) bit/bits of the m-bit digital control signal are at the other logical level (e.g., "1") for consecutive $2^{(m-n)}$ occurrences of the modulation bit. The fluctuating value, when the temporal average thereof is taken, can represent an intermediate value between "0" and "1". For example, when the value of the lower two bits is "3", the fluctuating value is "01110111 ... ", and when the value is "2", the fluctuating value is "01010101 . . . . .". In these cases, the temporal average of the fluctuating value is "0.75" and "0.5", respectively, indicating that the 1-bit modulation bit can represent a value of a substantially higher precision (a precision corresponding to two bits). Thus, according to the present invention, the fluctuating value is used, whereby the temporal average precision of the modulation bit can be substantially the same as an (m−n)-bit precision.

It is more preferred that: n=m−1; and the bit modulation section produces, as the modulation bit, a fixed value "0" if a lower one bit of the m-bit digital control signal is "0", whereas the bit modulation section produces, as the modulation bit, a fluctuating value that alternately takes "0" and "1" if the lower one bit of the m-bit digital control signal is "1".

It is preferred that: the m-bit digital control signal is modulated so that a temporal average precision thereof is substantially higher than m bits; and the bit modulation section produces the modulation bit so that the temporal average precision of the modulation bit and a temporal average precision of the lower (m−n) bit/bits of the m-bit digital control signal are substantially the same.

In this way, in a case where the m-bit digital control signal, which is input to the D/A converter, is modulated so that the temporal average precision thereof is increased to be substantially higher than m bits (for example, in the case of a variable value), the modulation bit is produced so that the precision thereof is substantially the same as the increased precision. Thus, the resolution of the D/A converter can be increased according to the precision of the input digital control signal.

It is more preferred that: n=m−1; and the bit modulation section produces, as the modulation bit, a fluctuating value that takes "1" when a lower one bit of the m-bit digital control signal takes "1" twice.

It is preferred that the analog filter changes a cut-off frequency for the analog control signal according to an operating clock of the signal processing device.

In order to achieve the objects set forth above, the present invention also provides a D/A converter, including: a bit modulation section for modulating an m-bit (m is a positive integer) digital signal into n-bit (n is a positive integer: n<m) intermediate digital signal whose temporal average precision is substantially the same as a precision of the m-bit digital signal; a D/A conversion section for converting the n-bit intermediate digital signal into an intermediate analog signal having a range corresponding to m bits; and an analog filter for smoothing the intermediate analog signal so as to output the smoothed signal as an analog signal whose precision is substantially the same as that of the m-bit digital signal.

It is preferred that the bit modulation section produces, from lower (m−n) bit/bits of the m-bit digital signal, a 1-bit modulation bit whose temporal average precision is substantially the same as an (m−n)-bit precision so as to produce the n-bit intermediate digital signal by adding together upper n bit/bits of the m-bit digital signal and the modulation bit.

In order to achieve the objects set forth above, the present invention also provides a D/A converter, including: a bit modulation section for producing, from lower (m−n) bit/bits (m and n are each a positive integer: n<m) of an m-bit digital signal, a 1-bit modulation bit whose temporal average precision is substantially the same as an (m−n)-bit precision; a D/A conversion section for converting upper n bit/bits of the m-bit digital signal into a first intermediate analog signal having a range corresponding to m bits; a power supply section, which is capable of outputting an analog value corresponding to one bit in the D/A conversion section, and which outputs a second intermediate analog signal in response to the modulation bit as a switching signal; an adder for adding together the first and second intermediate analog signals; and an analog filter for smoothing an output from the adder so as to output the smoothed signal as an analog signal whose precision is substantially the same as that of the m-bit digital signal.

It is preferred that: the m-bit digital signal is modulated so that a temporal average precision thereof is substantially higher than m bits; and the bit modulation section produces the modulation bit so that the temporal average precision of the modulation bit and a temporal average precision of the lower (m−n) bit/bits of the m-bit digital signal are substantially the same.

DESCRIPTION OF THE PREFERRED EMBODIMENTS

Figure 1:
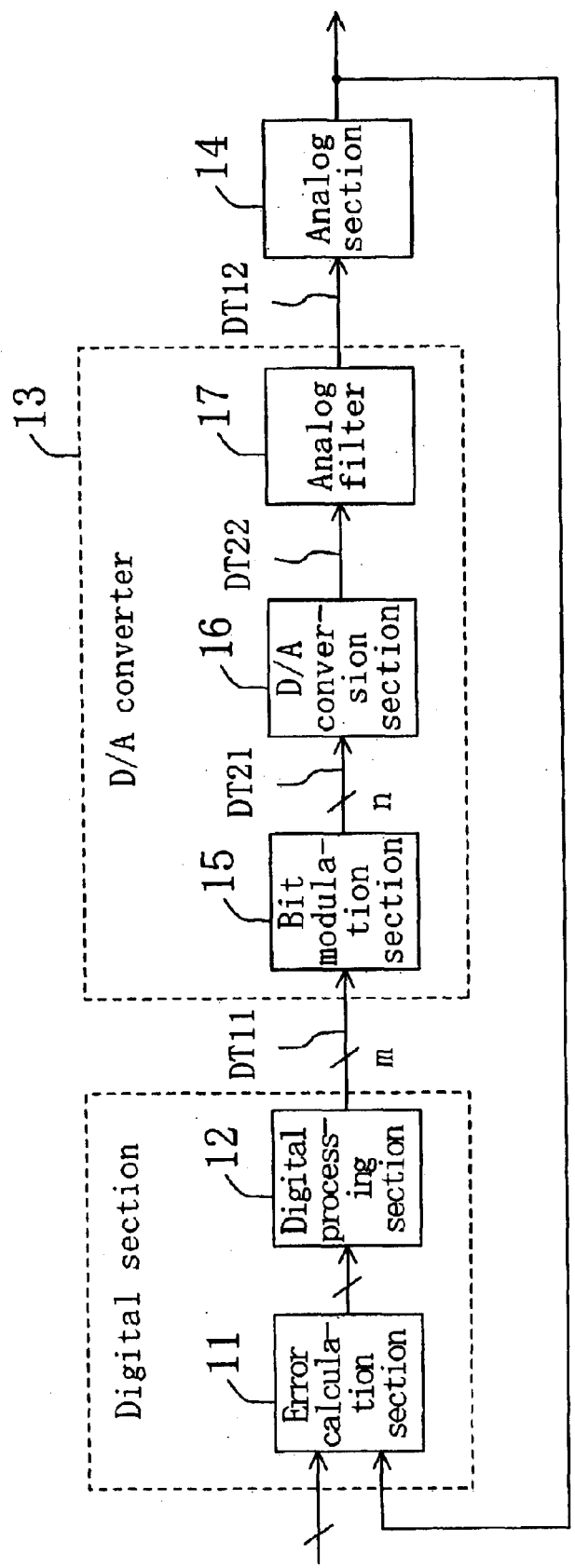
FIG. 1 is a diagram illustrating a configuration of a signal processing device of the present invention.

FIG. 1 illustrates a configuration of a signal processing device of the present invention. The signal processing device of FIG. 1 includes an analog-digital mixed loop having a digital section and an analog section for converging a loop output to a target value through the analog-digital mixed loop.

First, an error calculation section 11 calculates the error between the fed-back loop output and the target value, and a digital processing section 12 produces an m-bit digital control signal DT11 based on the calculated error amount. The digital control signal DT11 is converted by a D/A converter 13 into an analog control signal DT12 having substantially the same precision as that of the digital control signal DT11.

In the D/A converter 13, a bit modulation section 15 modulates the digital control signal DT11 to produce an n-bit (n<m) intermediate digital signal DT21. Herein, the temporal average precision of the intermediate digital signal DT21 is substantially the same as the precision of the digital control signal DT11. A D/A conversion section 16 converts the intermediate digital signal DT21 into an intermediate analog signal DT22 having a range corresponding to m bits. Then, an analog filter 17 smoothes the intermediate analog signal DT22 and outputs the smoothed signal as the analog control signal DT12. An analog section 14 outputs a corrected loop output based on the analog control signal DT12.

Figure 14:
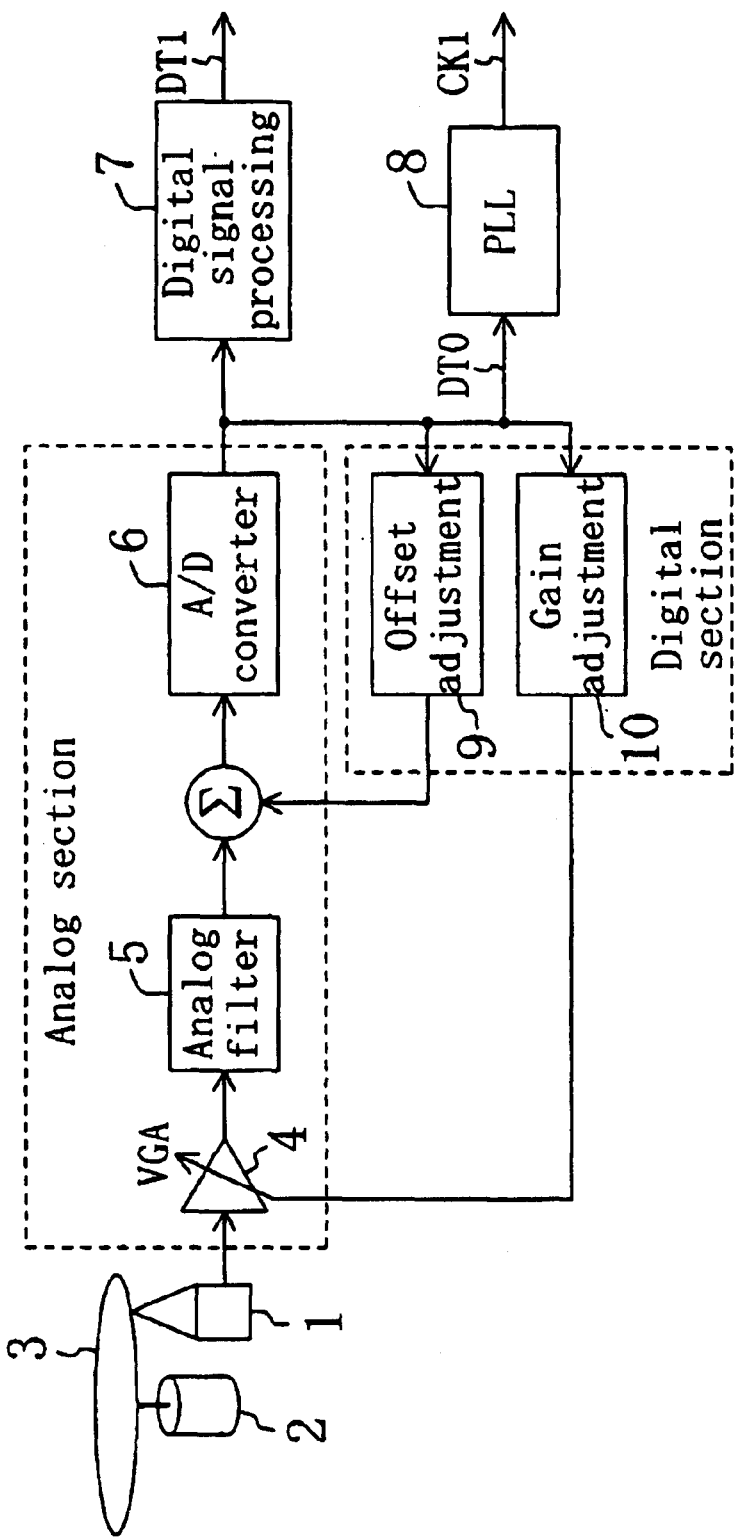
FIG. 14 is a diagram illustrating a configuration of a reproduction signal processing device.

Preferred embodiments of the present invention, where the signal processing device of FIG. 1 is applied to the PLL block 8 of FIG. 14, will now be described with reference to the drawings.

First Embodiment

Figure 2:
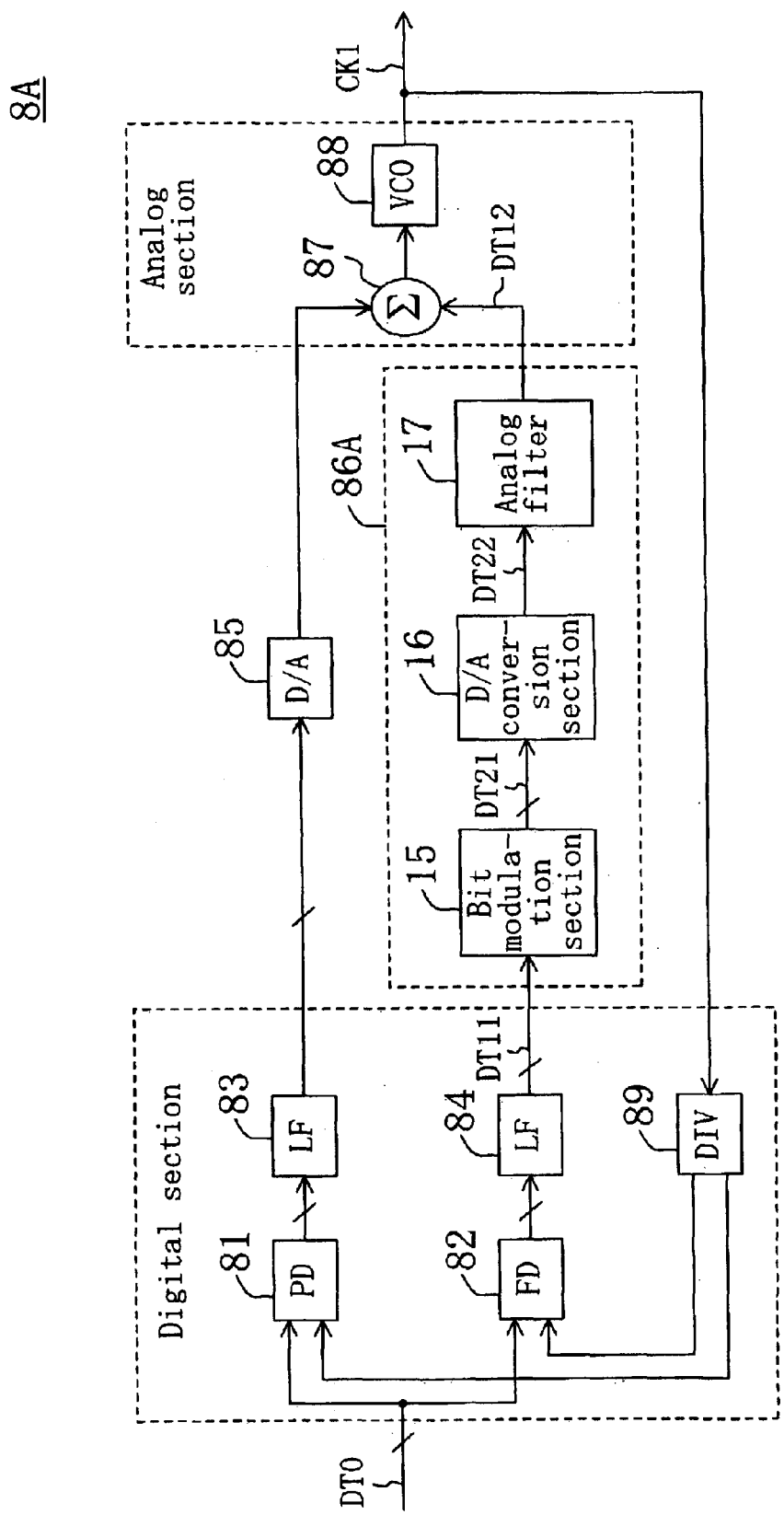
FIG. 2 is a diagram illustrating a configuration of a PLL block according to a first embodiment of the present invention.
Figure 15:
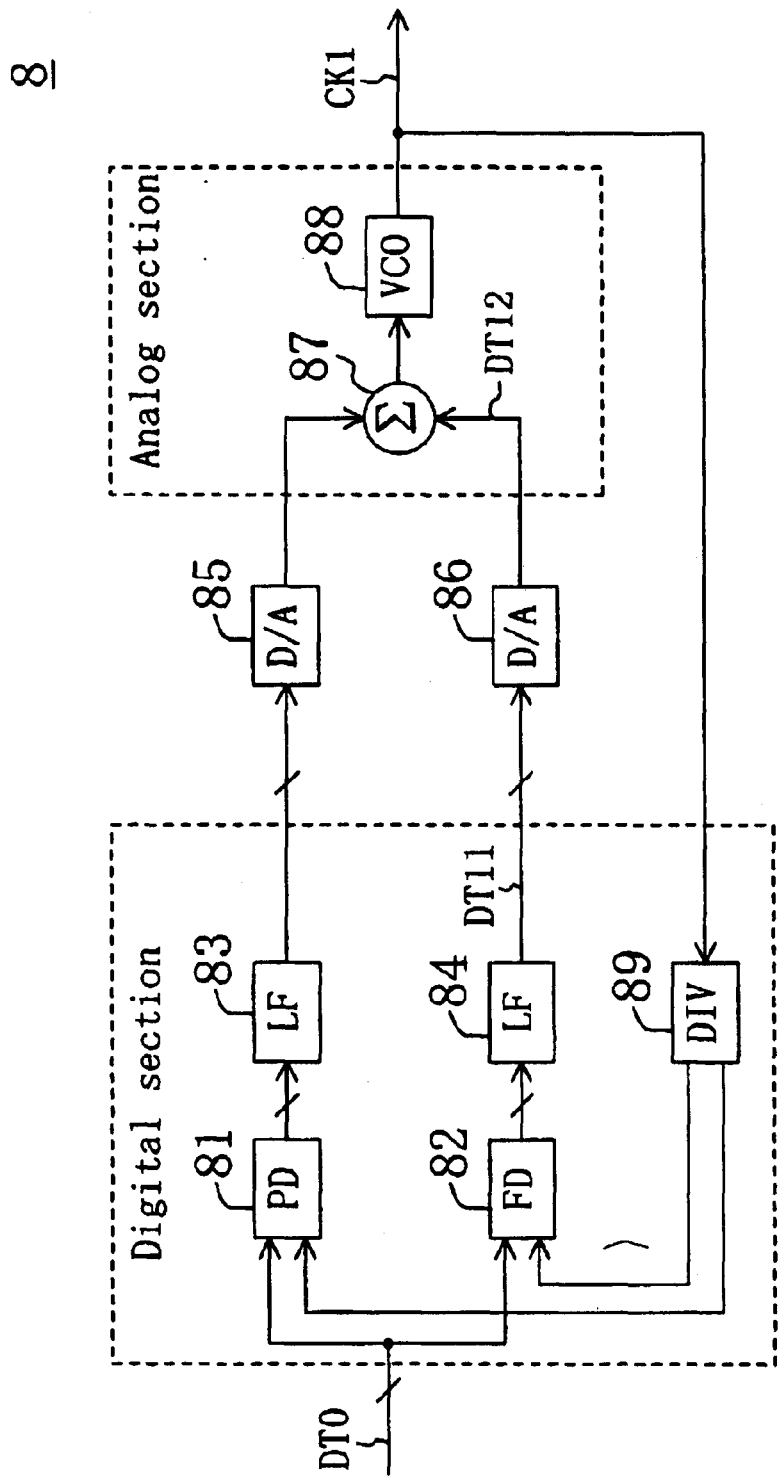
FIG. 15 is a diagram illustrating a configuration of a PLL block in the reproduction signal processing device of FIG. 14.
Figure 16:
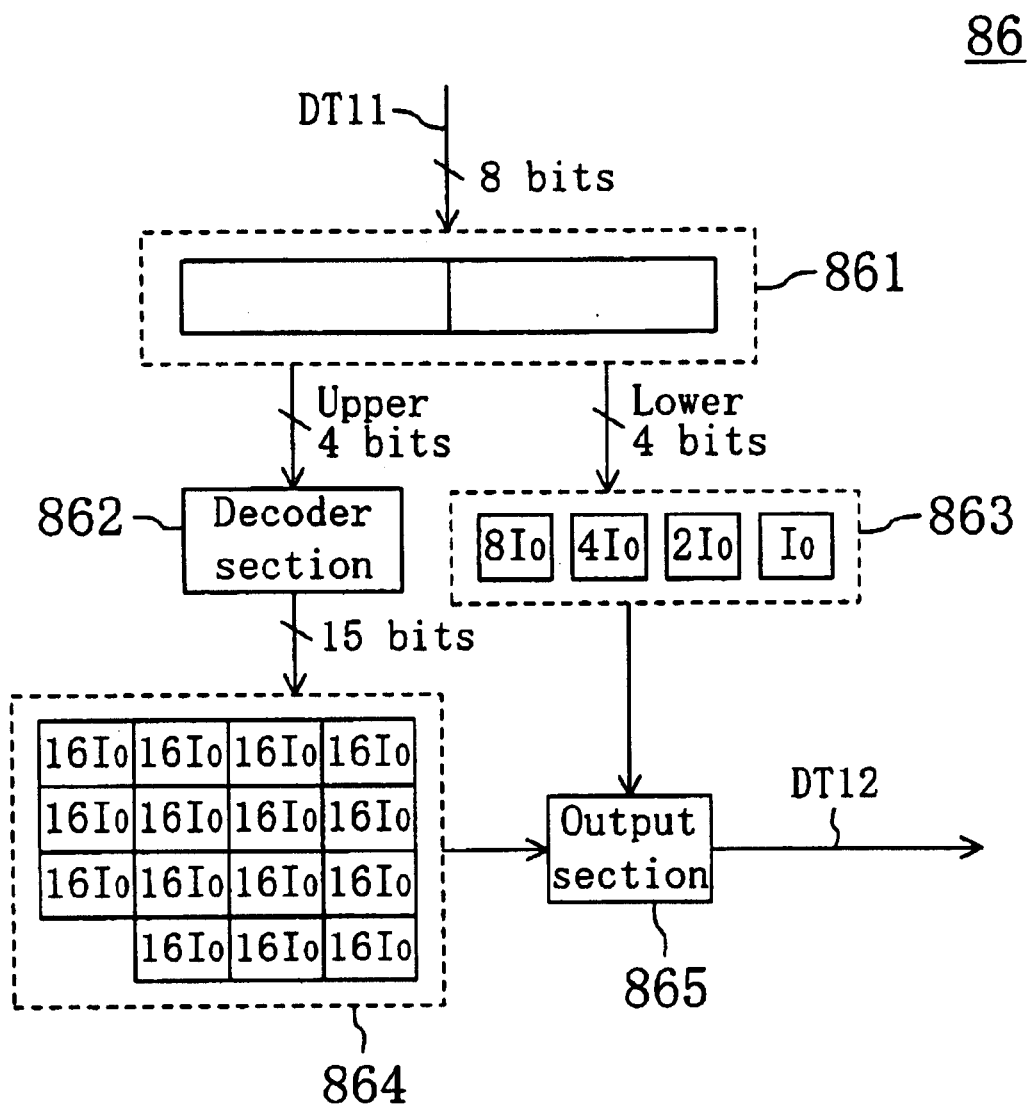
FIG. 16 is a diagram illustrating a configuration of a D/A converter in the PLL block of FIG. 15.

FIG. 2 illustrates a configuration of a PLL block 8A according to the first embodiment of the present invention. The PLL block 8A of the present embodiment includes a D/A converter 86A, instead of the D/A converter 86 of FIG. 15.

The PLL block 8A includes a phase comparator 81, a frequency comparator 82, a digital filter 83 for smoothing the phase error to output an 8-bit digital control signal, a digital filter 84 for smoothing the frequency error to output an 8-bit digital control signal DT11, D/A converters 85 and 86A, an adder 87 for adding together the outputs of the D/A converters 85 and 86A, a VCO 88 for changing the oscillation frequency of the output clock CK1 according to the output of the adder 87, and a frequency divider 89 for dividing the frequency of the output clock CK1 to produce a frequency-divided clock. Note that the comparators 81 and 82 and the digital filters 83 and 84 correspond to the "digital section" of the present invention, and the adder 87 and the VCO 88 correspond to the "analog section" of the present invention.

The frequency comparator 82 receives a digital signal DT0, which is obtained by quantizing the reproduction signal read out from an optical disk, or the like, in the form of two's complement. For example, in the case of a CD reproducing apparatus, the data interval of the reproduction signal is limited to 3T to 11T, where T is the channel bit interval. Therefore, the frequency comparator 82 watches the interval between zero-crossing points of the quantized digital signal DT0 and calculates, as the frequency error, the difference between the interval and the maximum expected value of the interval (11T) or the minimum expected value thereof (3T). Then, the digital filter 84 integrates the calculated frequency errors and outputs the integration result as the 8-bit digital control signal DT11.

The digital control signal DT11 is converted by the D/A converter 86A into the analog control signal DT12. The configuration and the operation of the D/A converter 86A will be described later in detail.

The analog control signal DT12 is used as the control input of the VCO 88 for controlling the frequency of the output clock CK1 so that the frequency error calculated by the frequency comparator 82 is reduced to zero. When the frequency of the output clock CK1 of the VCO 88 becomes equal to that of the digital signal DT0, the digital control signal DT11 output from the digital filter 84 is settled into a steady state. Upon completion of a frequency pull-in operation as described above, a phase correction operation is performed in the phase detection loop (81-83-85-87-88-89).

Now, the D/A converter 86A will be described in detail.

The D/A converter 86A includes the bit modulation section 15, the D/A conversion section 16 and the analog filter 17.

Figure 3:
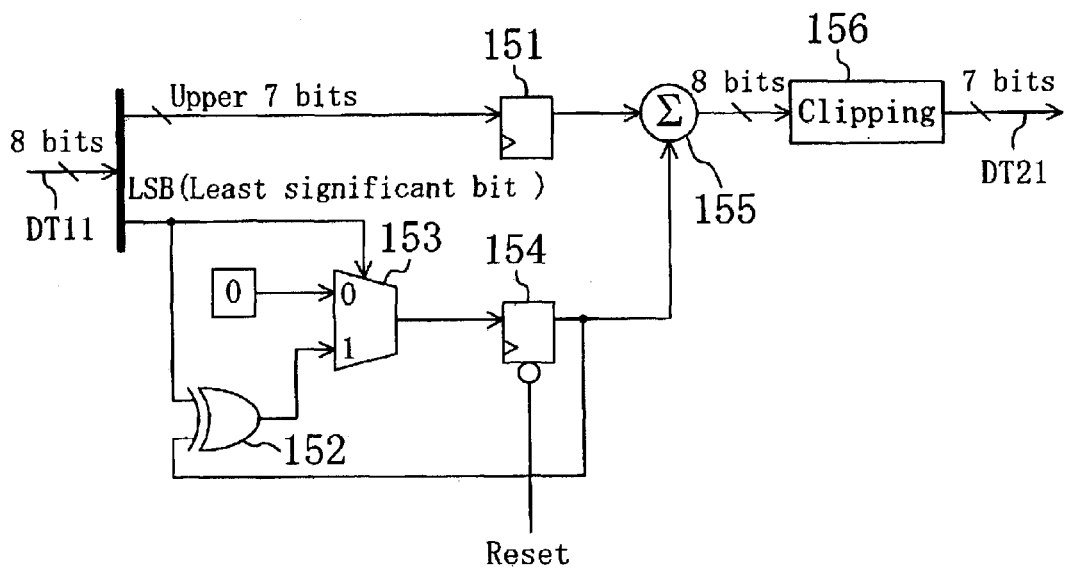
FIG. 3 is a diagram illustrating a configuration of a bit modulation section in the PLL block of FIG. 2.

FIG. 3 illustrates a configuration of the bit modulation section 15. The bit modulation section 15 modulates the 8-bit digital control signal DT 11 to output the 7-bit intermediate digital signal DT21.

A register 151 stores and outputs the upper seven bits of the digital control signal DT11. On the other hand, a register 154, storing "0" as its initial value, stores and outputs the output from a selector 153. Note that the 1-bit signal output from the register 154 corresponds to the "modulation bit" of the present invention.

The selector 153 uses "0" as its reference value, and outputs a fixed value whose logical level is "0" when the value of the LSB (least significant bit) of the digital control signal DT11 is "0", i.e., when it is equal to the reference value. On the other hand, when the value of the LSB of the digital control signal DT11 is "1", i.e., when it is not equal to the reference value, the selector 153 selects the output from an EXOR circuit 152. Note that when the value of the LSB is "1", the output of the EXOR circuit 152 is a fluctuating value that alternately takes "0" and "1", e.g., "1, 0, 1, 0, . . . ".

The outputs from the registers 151 and 154 are added together by an adder 155, after which the obtained signal is clipped by a clipping circuit 156 and output as the 7-bit intermediate digital signal DT21.

With the bit modulation section 15 having such a configuration, when "00100011" ("35" in decimal notation), for example, is received as the digital control signal DT11, the 7-bit intermediate digital signal DT21 to be output is a fluctuating value that alternately takes "0010010" ("18" in decimal notation) and "0010001" ("17" in decimal notation).

Figure 4:
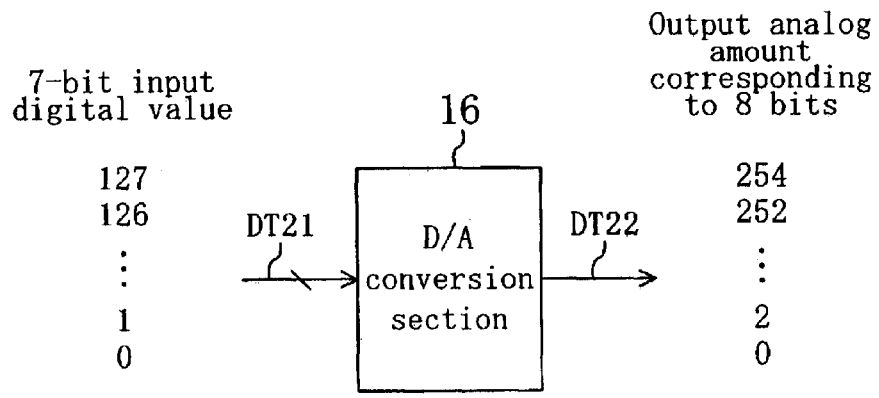
FIG. 4 is a diagram illustrating the input-output correlation of a D/A conversion section in the PLL block of FIG. 2.

Next, FIG. 4 illustrates the input-output correlation of the D/A conversion section 16. The D/A conversion section 16 receives the 7-bit intermediate digital signal DT21, and outputs the intermediate analog signal DT22 having a range corresponding to eight bits. In FIG. 4, the range of the intermediate digital signal DT21 to be input to the D/A conversion section 16 is 0 to 127, and the range of the intermediate analog signal DT22 to be output from the D/A conversion section 16 is 0 to 254 (although the signal DT22 only takes even numbers in the range).

The instantaneous value of the intermediate analog signal DT22 has a precision corresponding to seven bits and is an even number. However, it is possible to output an odd number by the smoothing operation through the analog filter 17, thereby obtaining the analog control signal DT12 substantially having a precision corresponding to eight bits.

Figure 5:
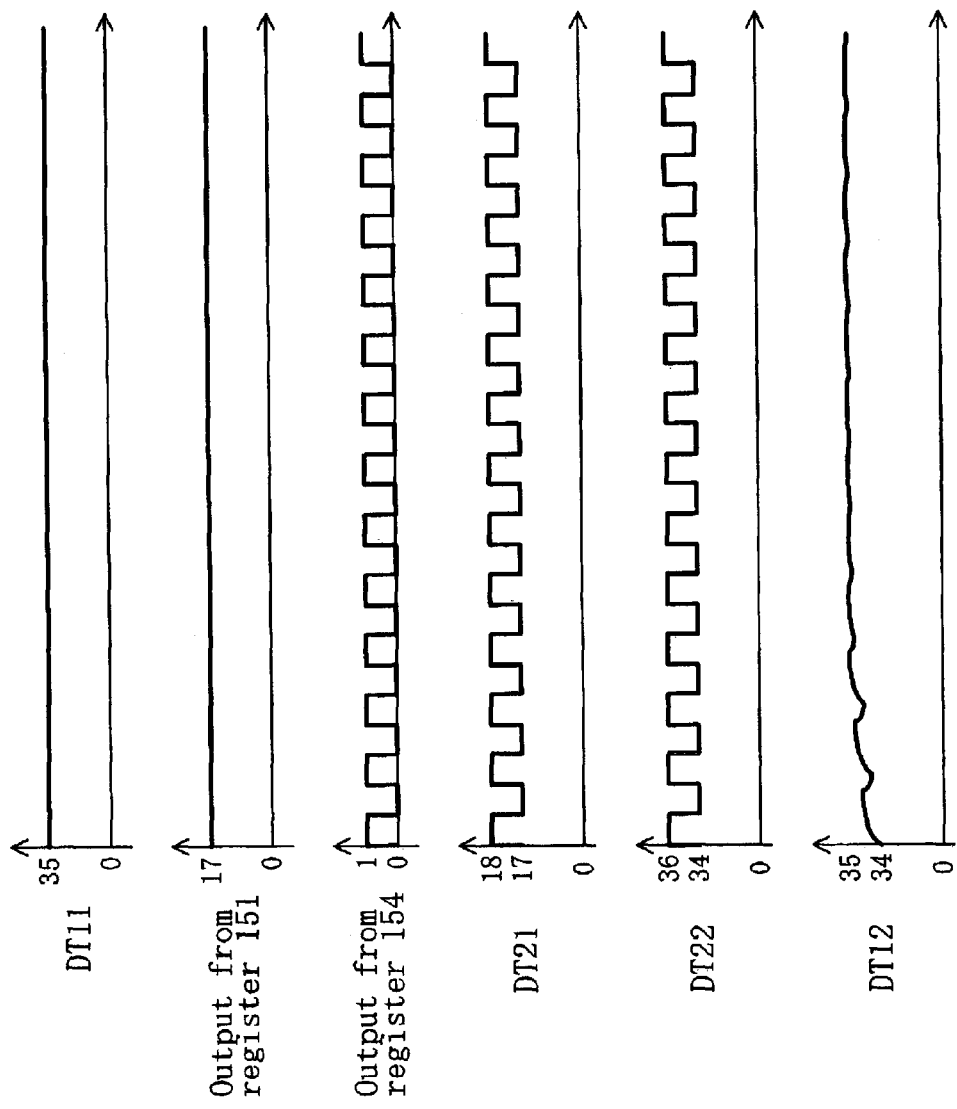
FIG. 5 is a timing chart of a D/A converter in the PLL block of FIG. 2.

FIG. 5 is a timing chart illustrating a case where "00100011" ("35" in decimal notation) is input to the D/A converter 86A as the digital control signal DT11. The digital control signal DT11 is modulated by the bit modulation section 15 into the 7-bit intermediate digital signal DT21. The intermediate digital signal DT21 is a fluctuating value that alternately takes "18" and "17", as described above.

The intermediate digital signal DT21 is converted by the D/A conversion section 16 into the intermediate analog signal DT22 having a range corresponding to eight bits. As is the intermediate digital signal DT21, the intermediate analog signal DT22 is also a fluctuating value, which alternately takes "36" and "34". By the smoothing operation through the analog filter 17, the intermediate analog signal DT22 converges to "35", which is the value indicated by the digital control signal DT11. As a result, "35" is obtained as the value of the analog control signal DT12.

As described above, according to the present embodiment, the operational bit width of the D/A conversion section 16 in the D/A converter 86A can be reduced from eight bits to seven bits, without sacrificing the resolution of the D/A converter 86A. In this way, it is possible to reduce the circuit area while maintaining the loop performance of the PLL block 8A.

Note that while the bit modulation section 15 receives the 8-bit digital control signal DT11 and outputs the 7-bit intermediate digital signal DT21 in the example described above, the present invention is not limited to this. Generally, the bit modulation section 15 can receive an m-bit (where m is a positive integer) digital control signal DT11 and output an n-bit (where n is a positive integer: n<m) intermediate digital signal DT21. In such a case, the 1-bit modulation bit can be produced from the lower (m−n) bit/bits of the digital control signal DT11, instead of the LSB of the digital control signal DT11 in FIG. 3.

Moreover, in the example described above, the selector 153 in the bit modulation section 15 uses "0" as its reference value, and outputs a fixed value whose logical level is "0" when the value of the LSB of the digital control signal DT11 is "0", while selecting the output from the EXOR circuit 152 when it is "1". Alternatively, the reference value may be "1", in which case the bit modulation section 15 selects the output of the EXOR circuit 152 when the value of the LSB is "0", while outputting a fixed value whose logical level is "1" when it is "1".

Second Embodiment

Figure 6:
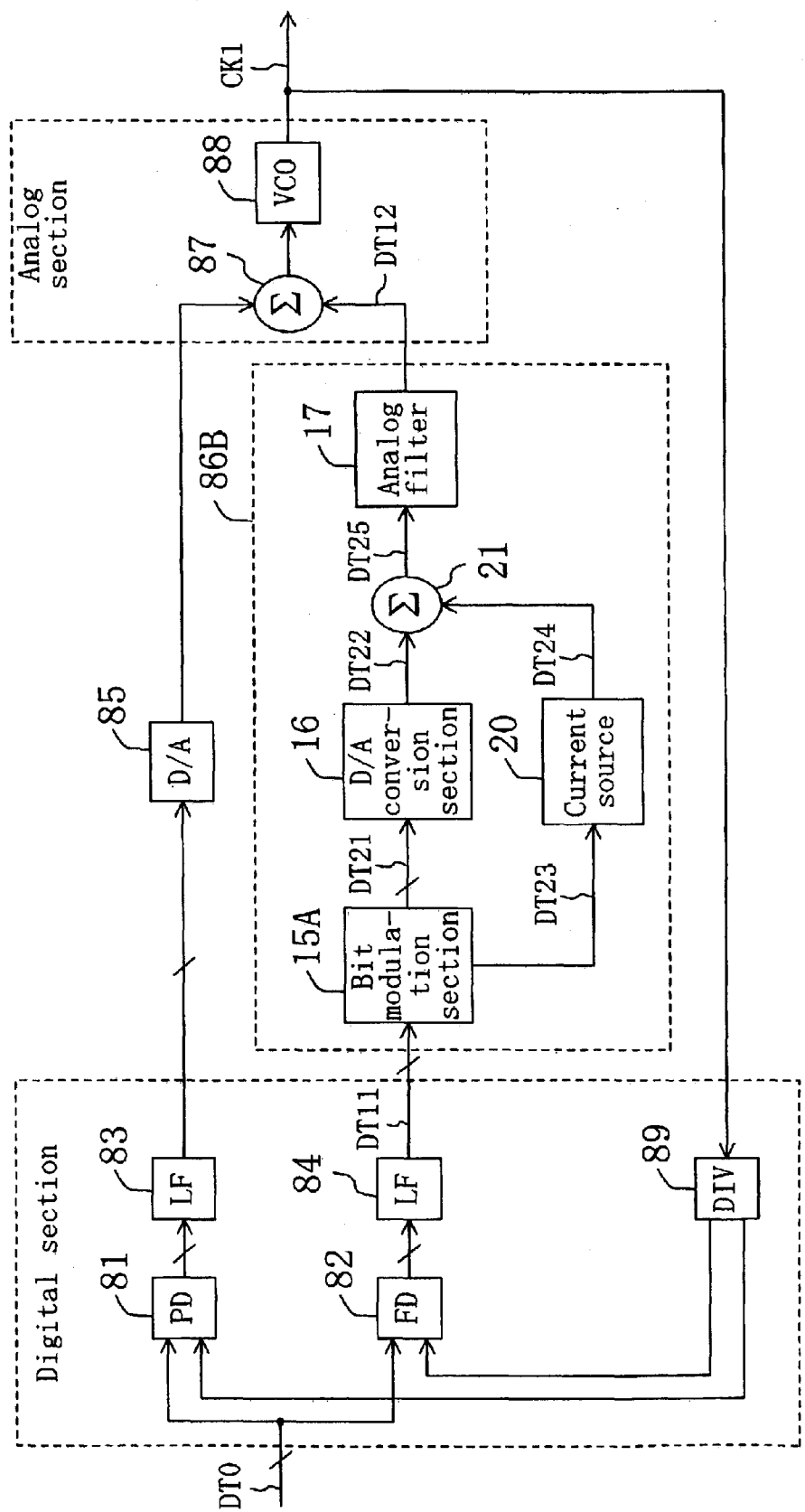
FIG. 6 is a diagram illustrating a configuration of a PLL block according to a second embodiment of the present invention.

FIG. 6 illustrates a configuration of a PLL block 8B according to the second embodiment of the present invention. The PLL block 8B of the present embodiment includes a D/A converter 86B, instead of the D/A converter 86A in the PLL block 8A of the first embodiment. The D/A converter 86B will now be described in detail.

The D/A converter 86B includes a bit modulation section 15A, the D/A conversion section 16, the analog filter 17, a current source 20 and an adder 21. Note that the current source 20 corresponds to the "power supply section" of the present invention.

Figure 7:
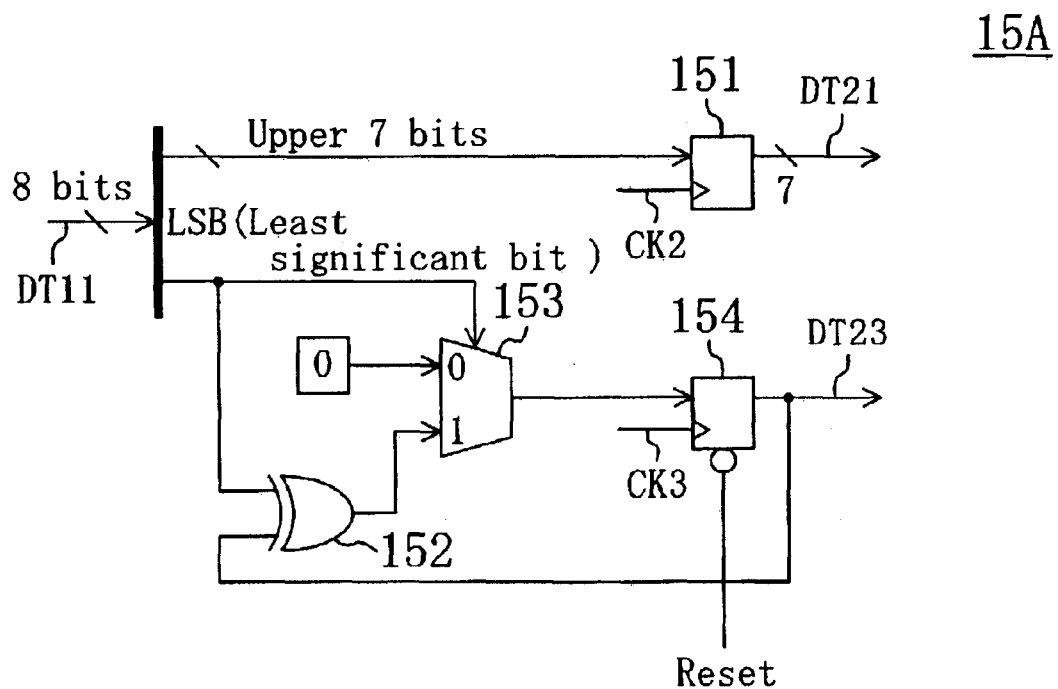
FIG. 7 is a diagram illustrating a configuration of a bit modulation section in the PLL block of FIG. 6.

FIG. 7 illustrates a configuration of the bit modulation section 15A. The bit modulation section 15A receives the digital control signal DT11, and outputs the 7-bit signal DT21 and a 1-bit modulation bit DT23 based on the digital control signal DT11.

The output of the register 151 is the 7-bit signal DT21, which is the output of the bit modulation section 15A. Thus, the upper seven bits of the digital control signal DT11 are output, as they are, as the signal DT21. Moreover, the output of the register 154 is the modulation bit DT23. Note that it is herein assumed that the register 151 operates in synchronization with a clock CK2 (corresponding to the "first operating clock" of the present invention), which is the operating clock of the D/A conversion section 16. Moreover, it is assumed that the register 154 operates in synchronization with a clock CK3 (corresponding to the "second operating clock" of the present invention), which is faster than the clock CK2.

Figure 8:
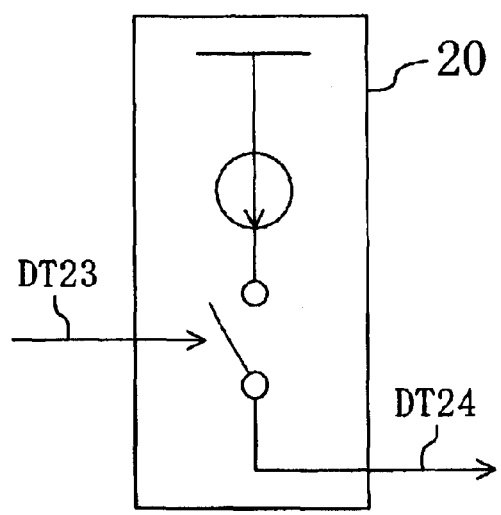
FIG. 8 is a diagram illustrating a configuration of a current source in the PLL block of FIG. 6.

FIG. 8 illustrates a configuration of the current source 20. The current source 20 is a clock-less power supply circuit, which is capable of outputting an analog value corresponding to one bit in the D/A conversion section 16, and which outputs an intermediate analog signal DT24 (corresponding to the "second intermediate analog signal" of the present invention) in response to the modulation bit DT23 as the switching signal. It is herein assumed that the analog value corresponding to one bit in the D/A conversion section 16 is "2".

The adder 21 adds together the intermediate analog signal DT22 (corresponding to the "first intermediate analog signal" of the present invention) output from the D/A conversion section 16 and the intermediate analog signal DT24 output from the current source 20 to output an analog signal DT25.

Figure 9:
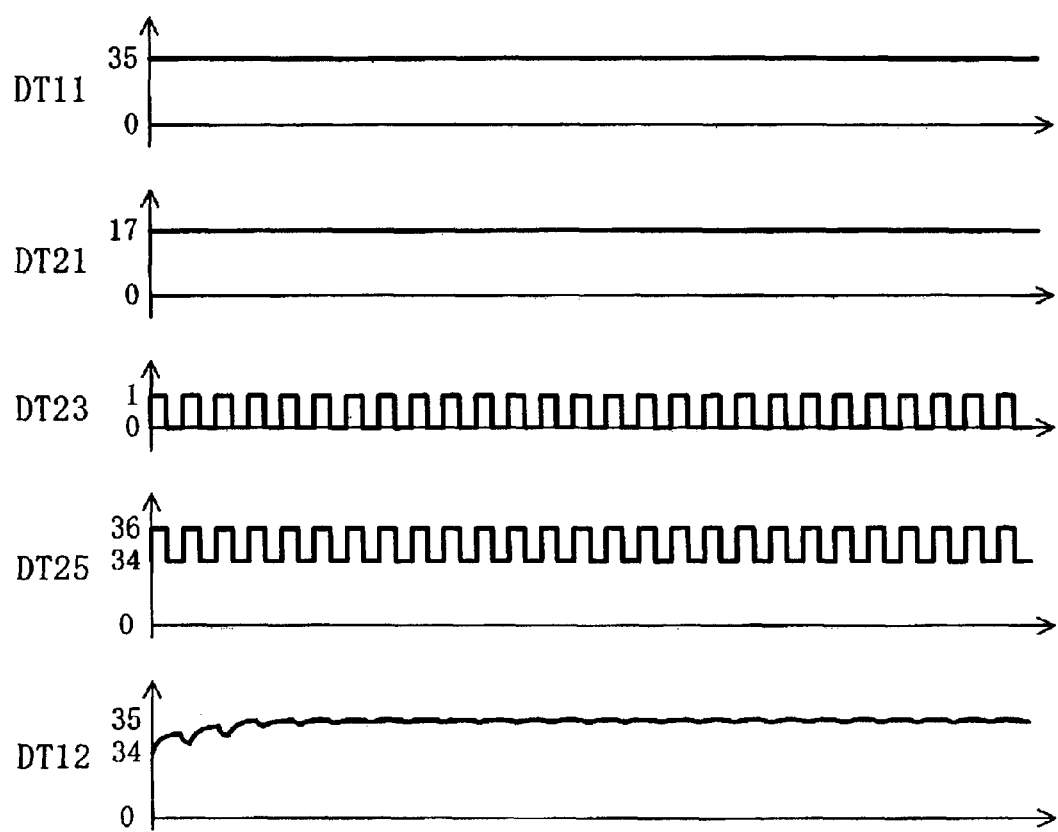
FIG. 9 is a timing chart of a D/A converter in the PLL block of FIG. 6.

FIG. 9 is a timing chart illustrating a case where "00100011" ("35" in decimal notation) is input to the D/A converter 86B as the digital control signal DT11. Based on the digital control signal DT11, the bit modulation section 15A outputs "17" as the 7-bit signal DT21, and a fluctuating value that alternately takes "1" and "0" as the modulation bit DT23. As is the modulation bit DT23, the analog signal DT25 output from the adder 21 is also a fluctuating value that alternately takes "36" and "34". By the smoothing operation through the analog filter 17, the analog signal DT25 converges to "35", which is the value indicated by the digital control signal DT11. As a result, "35" is obtained as the value of the analog control signal DT12.

As described above, according to the present embodiment, the modulation bit DT23 is produced in synchronization with the clock CK3, which is faster than the operating clock CK2 of the D/A conversion section 16, and is used as the switching signal of the clock-less current source 20. In this way, the analog control signal DT12 more quickly converges to a smoothed value, and the loop characteristic can be more quickly brought into a steady state, as compared to the first embodiment.

Note that while the current source 20 for controlling the presence/absence of a current is used as the power supply section in the present embodiment, the present invention is not limited to this. For example, in the case of a circuit that handles the voltage of the analog signal DT25, a voltage source for controlling the presence/absence of a voltage may be used instead of the current source 20.

Third Embodiment

Figure 10:
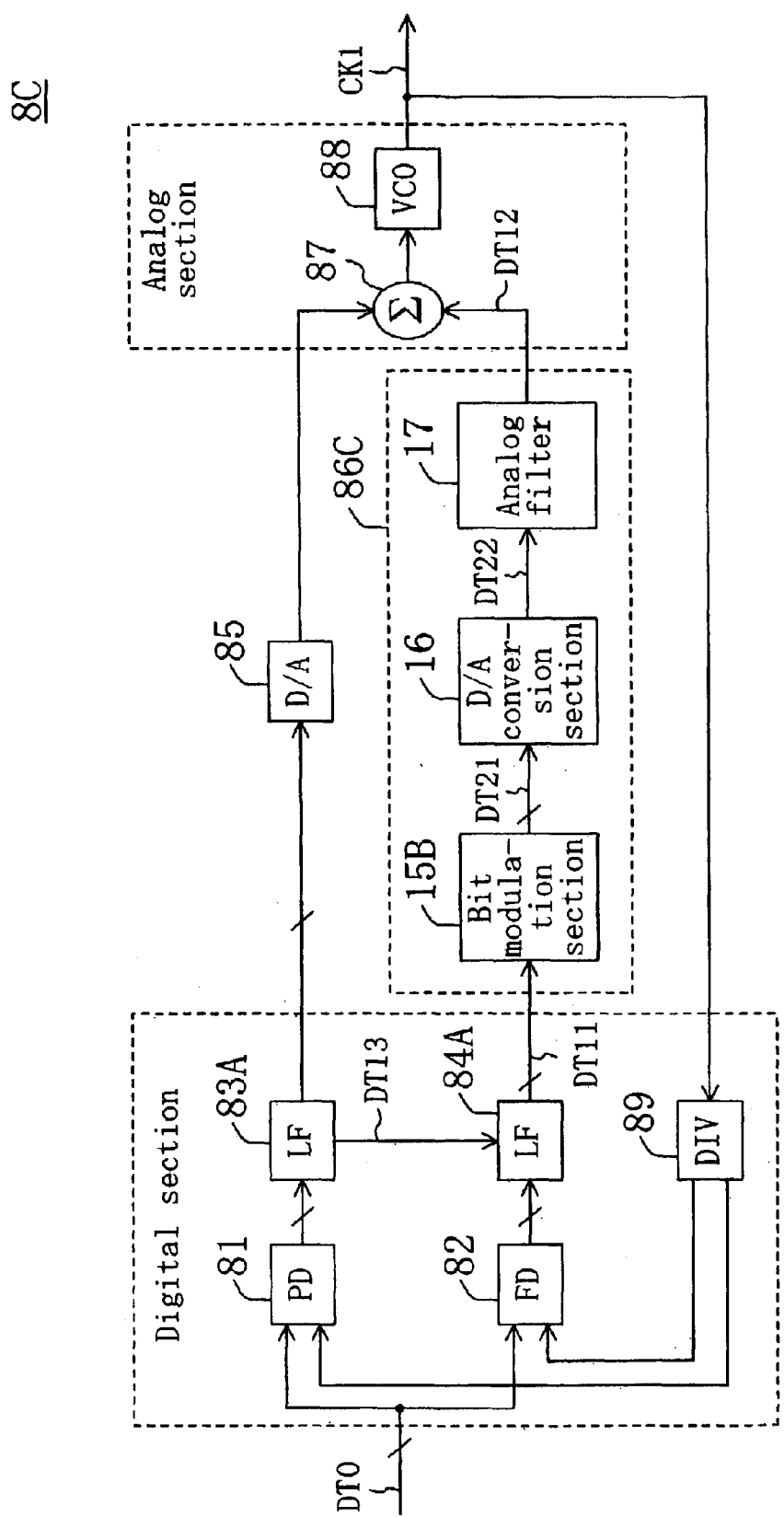
FIG. 10 is a diagram illustrating a configuration of a PLL block according to a third embodiment of the present invention.

FIG. 10 illustrates a configuration of a PLL block 8C according to the third embodiment of the present invention. The PLL block 8C of the present embodiment includes a D/A converter 86C, instead of the D/A converter 86A in the PLL block 8A of the first embodiment.

Typically, the range of the oscillation frequency of the VCO 88 to be controlled through the phase loop (81-83A-85-87-88-89) is quite narrower than that for the frequency loop (82-84A-86C-87-88-89). For example, the output range of the D/A converter 85 for the phase loop is set to be about 10% of the output range of the D/A converter 86C for the frequency loop.

With recording media such as CDs, the recording frequency for an inner track of the disk is different from an outer track of the disk. When recorded signals are reproduced from such a medium, even after the phase loop is brought into a steady state, the frequency of reproduced data changes gradually. Therefore, in the phase loop, the amount of change in the frequency of the reproduction signals needs to be absorbed gradually while reproducing data.

However, the range of the oscillation frequency of the VCO 88 that can be controlled through the phase loop is narrow as described above. In view of this, as the phase loop approaches its saturated state, the value of the digital control signal DT11 used in the frequency loop is changed by "1", thereby avoiding the saturation of the phase loop.

With the PLL block SC of the present embodiment, it is possible to avoid the saturation of the phase loop.

In the operation of changing the value of the digital control signal DT11 by "1", if the value is abruptly changed by one bit, the oscillation frequency of the VCO 88 increases/decreases substantially, whereby the phase loop may be unlocked. In view of this, a digital filter 83A in the phase loop outputs modulation data DT13 to a digital filter 84A in the frequency loop so that the frequency is increased/decreased gradually in the frequency loop. Based on the modulation data DT13, the digital filter 84A gradually changes the digital control signal DT11. As a result, it is possible to smoothly increase/decrease the frequency.

Figure 11:
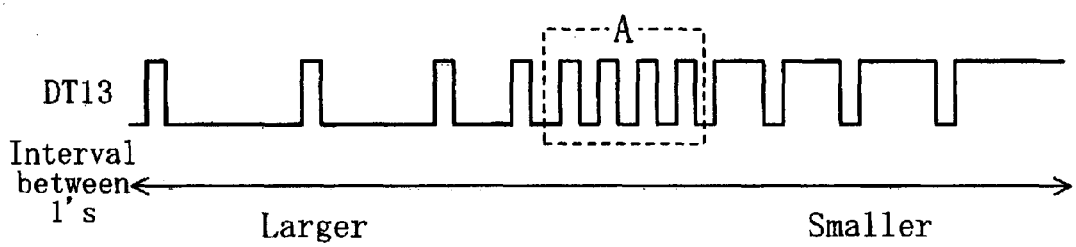
FIG. 11 is a waveform diagram of modulation data.

FIG. 11 illustrates the waveform of the modulation data DT13. It can be seen that the modulation data DT13 undergoes a smooth 1-bit change with the on-duty period thereof increasing gradually.

Figure 12:
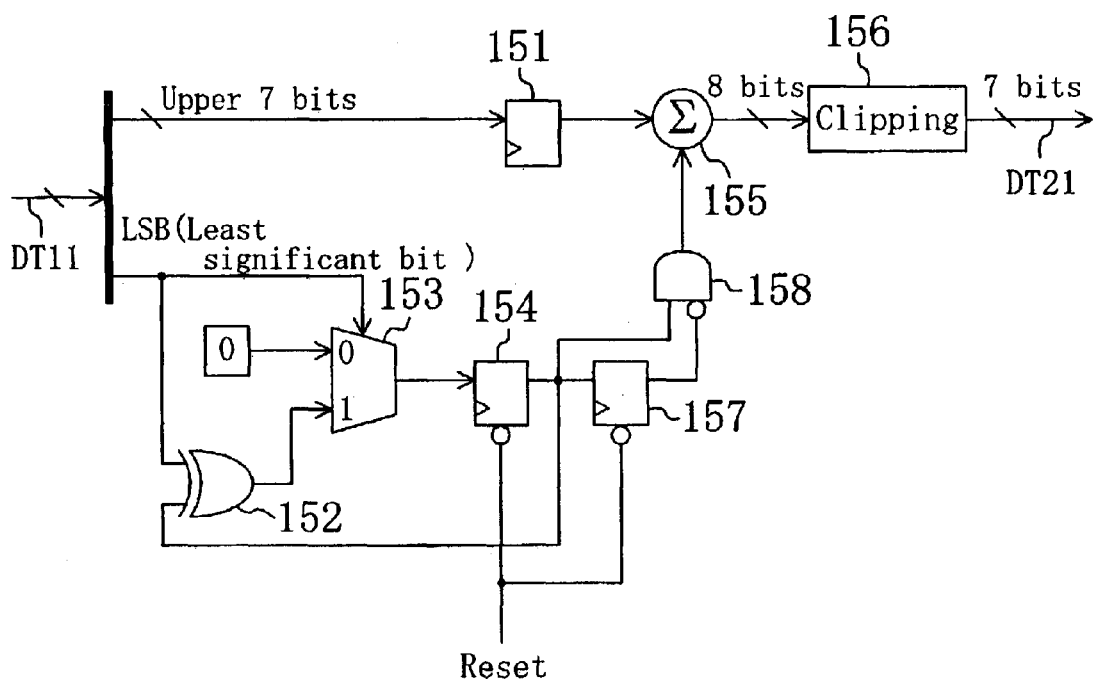
FIG. 12 is a diagram illustrating a configuration of a bit modulation section in the PLL block of FIG. 10.

FIG. 12 illustrates a configuration of a bit modulation section 15B in the PLL block 8C of the present embodiment. The bit modulation section 15B is designed to be suitable for cases as that described above where the frequency loop is controlled by the modulation data DT13, which is output from the phase loop to the frequency loop. An AND circuit 158 in the bit modulation section 15B counts the number of occurrences of the edge of the LSB of the 8-bit digital control signal DT11, and outputs "1" for one cycle for every two occurrences of the edge.

For example, assume a case where the digital filter 84A outputs "00000101" ("5" in decimal notation) as the 8-bit digital control signal DT11 and is in a steady state. In this case, the 7-bit intermediate digital signal DT21 output from the bit modulation section 15B is a fluctuating value that alternately takes "0000010" ("2" in decimal notation) and "0000011" ("3" in decimal notation). As a result, "5" is output as the analog control signal DT12.

As the phase loop approaches its saturated state, the modulation data DT13 as illustrated in FIG. 11 is output from the digital filter 83A. Thus, the digital control signal DT11 output from the digital filter 84A changes according to the modulation data DT13 to eventually take the value "00000110" ("6" in decimal notation).

Figure 13:
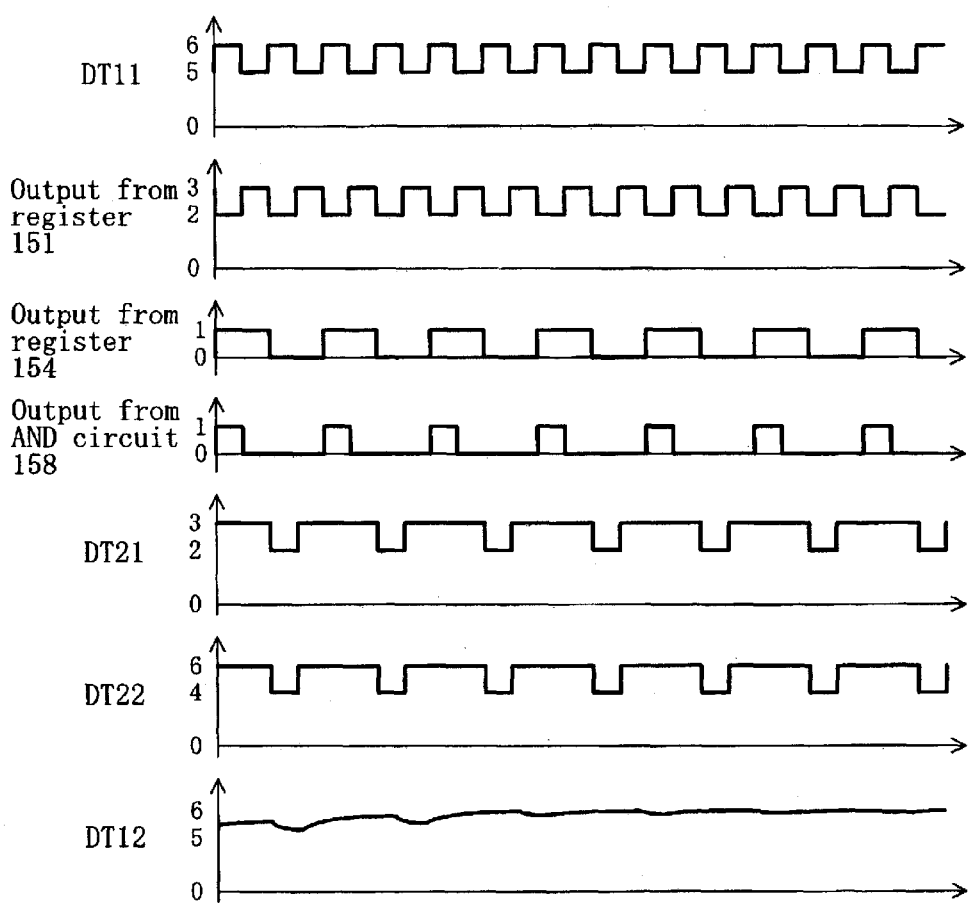
FIG. 13 is a timing chart of a D/A converter in the PLL block of FIG. 10.

FIG. 13 is a timing chart of the D/A converter 86C during a period denoted as "A" in FIG. 11. While the modulation data DT13 is fluctuating, the digital control signal DT11 is also a fluctuating value that alternately takes "5" and "6". At this time, the signal output from the register 151 is a fluctuating value that alternately takes "2" and "3". Moreover, the signal output from the AND circuit 158 is a fluctuating value that takes "1" for one cycle for every two occurrences of the edge of the output signal from the register 151. Thus, the 7-bit intermediate digital signal DT21 output from the bit modulation section 15B is "3, 3, 3, 2, 3, 3, 3, 2 . . . ."

According to the value of the 7-bit intermediate digital signal DT21, the value of the intermediate analog signal DT22 output from the D/A conversion section 16 is "6, 6, 6, 4, 6, 6, 6, 4, . . . ", whose temporal average is (6+6+6+4)/4=5.5. This coincides with the average of the fluctuating value of the digital control signal DT11, i.e., (6+5)/2=5.5, indicating that it is possible to obtain the analog control signal DT12 (whose value is "5.5") that substantially has a higher precision.

As described above, according to the present embodiment, in a case where the digital control signal DT11 gradually changes according to the modulation data DT13, which is input from outside the loop, it is possible to produce the analog control signal DT12 having a precision according to the change in the digital control signal DT11. In this way, it is possible to smoothly change the oscillation frequency of the VCO 88, and to realize a stable loop operation. Note that the control for avoiding the saturation of the phase loop as described in the present embodiment can also be applied to the second embodiment.

Note that in the embodiments described above, the cut-off frequency of the analog filter 17 is preferably changed according to the operating clock of the reproduction signal processing device (e.g., the disk-reproducing speed). This is because the optimal cut-off frequency when the oscillation frequency of the VCO 88 is 100 MHz is different from that when it is 200 MHz, for example. Therefore, with the variable cut-off frequency, the loop characteristic can be stabilized.

Moreover, while the embodiments have been described with respect to a case where the present invention is applied to a PLL block in a reproduction signal processing device, the present invention is not limited to this. The present invention can also be applied to other signal processing devices including an analog-digital mixed loop, e.g., the offset adjustment block 9 or the gain adjustment block 10 illustrated in FIG. 14, and effects as those described above can still be obtained.

As described above, according to the present invention, it is possible to provide a D/A converter in an analog-digital mixed loop in which the bit width for the internal operation is reduced, whereby the circuit area thereof can be reduced, while maintaining a high resolution. For example, in a case where a current-cell type D/A converter is used, it is possible to substantially reduce the circuit scale of the current cell matrix section and the decoder section. Moreover, in a signal processing device including an analog-digital mixed loop for converging a loop output to a target value through the analog-digital mixed loop, a D/A converter as described above can be used, whereby it is possible to reduce the circuit area of the device as a whole, thus reducing the cost.

What is claimed is:

1. A signal processing device including a loop having a digital section for processing a digital signal and an analog section for processing an analog signal for converging a loop output to a target value through the loop, the signal processing device comprising a D/A converter for converting an m-bit (m is a positive integer) digital control signal received from the digital section into an analog control signal having substantially the same precision as that of the m-bit digital control signal so as to output the analog control signal to the analog section, the D/A converter including:
   a bit modulation section for modulating the m-bit digital control signal into an n-bit (n is a positive integer: n<m) intermediate digital signal whose temporal average precision is substantially the same as the precision of the m-bit digital control signal;
   a D/A conversion section for converting the n-bit intermediate digital signal into an intermediate analog signal having a range corresponding to m bits; and
   an analog filter for smoothing the intermediate analog signal so as to output the smoothed signal as the analog control signal.

2. The signal processing device of claim 1, wherein the bit modulation section produces, from lower (m−n) bit/bits of the m-bit digital control signal, a 1-bit modulation bit whose temporal average precision is substantially the same as an (m−n)-bit precision so as to produce the n-bit intermediate digital signal by adding together upper n bit/bits of the m-bit digital control signal and the modulation bit.

3. The signal processing device of claim 2, wherein the bit modulation section produces, as the modulation bit, a fixed value at one logical level if a value of the lower (m−n) bit/bits of the m-bit digital control signal is equal to a predetermined reference value, whereas the bit modulation section produces, as the modulation bit, a fluctuating value in which a number of bits corresponding to the value of the lower (m−n) bit/bits of the m-bit digital control signal are at the other logical level for consecutive 2(m−n) occurrences of the modulation bit if the value of the lower (m−n) bit/bits of the m-bit digital control signal is not equal to the predetermined reference value.

4. The signal processing device of claim 3, wherein:
   n=m−1; and
   the bit modulation section produces, as the modulation bit, a fixed value "0" if a lower one bit of the m-bit digital control signal is "o", whereas the bit modulation section produces, as the modulation bit, a fluctuating value that alternately takes "0" and "1" if the lower one bit of the m-bit digital control signal is "1".

5. The signal processing device of claim 2, wherein:
   the m-bit digital control signal is modulated so that a temporal average precision thereof is substantially higher than m bits; and
   the bit modulation section produces the modulation bit so that the temporal average precision of the modulation bit and a temporal average precision of the lower (m−n) bit/bits of the m-bit digital control signal are substantially the same.

6. The signal processing device of claim 5, wherein:
   n=m−1; and
   the bit modulation section produces, as the modulation bit, a fluctuating value that takes "1" when a lower one bit of the m-bit digital control signal takes "1" twice.

7. The signal processing device of claim 2, wherein the analog filter changes a cut-off frequency for the analog control signal according to an operating clock of the signal processing device.

8. A signal processing device including a loop having a digital section for processing a digital signal and an analog section for processing an analog signal for converging a loop output to a target value through the loop, the signal processing device comprising a D/A converter for converting an m-bit (m is a positive integer) digital control signal received from the digital section into an analog control signal having substantially the same precision as that of the m-bit digital control signal so as to output the analog control signal to the analog section, the D/A converter including:

a bit modulation section for producing, from lower (m−n) bit/bits (n is a positive integer: n<m) of the m-bit digital control signal, a 1-bit modulation bit whose temporal average precision is substantially the same as an (m−n)-bit precision;

a D/A conversion section for converting upper n bit/bits of the m-bit digital control signal into a first intermediate analog signal having a range corresponding to m bits;

a power supply section, which is capable of outputting an analog value corresponding to one bit in the D/A conversion section, and which outputs a second intermediate analog signal in response to the modulation bit as a switching signal;

an adder for adding together the first and second intermediate analog signals; and an analog filter for smoothing an output from the adder so as to output the smoothed signal as the analog control signal.

9. The signal processing device of claim 8, wherein the bit modulation section produces, as the modulation bit, a fixed value at one logical level if a value of the lower (m−n) bit/bits of the m-bit digital control signal is equal to a predetermined reference value, whereas the bit modulation section produces, as the modulation bit, a fluctuating value in which a number of bits corresponding to the value of the lower (m−n) bit/bits of the m-bit digital control signal are at the other logical level for consecutive $2^{(m-n)}$ occurrences of the modulation bit if the value of the lower (m−n) bit/bits of the m-bit digital control signal is not equal to the predetermined reference value.

10. The signal processing device of claim 9, wherein:
n=m−1; and
the bit modulation section produces, as the modulation bit, a fixed value "0" if a lower one bit of the m-bit digital control signal is "0", whereas the bit modulation section produces, as the modulation bit, a fluctuating value that alternately takes "0" and "1" if the lower one bit of the m-bit digital control signal is "1".

11. The signal processing device of claim 8, wherein:
the m-bit digital control signal is modulated so that a temporal average precision thereof is substantially higher than m bits; and
the bit modulation section produces the modulation bit so that the temporal average precision of the modulation bit and a temporal average precision of the lower (m−n) bit/bits of the m-bit digital control signal are substantially the same.

12. The signal processing device of claim 11, wherein:
n=m−1; and
the bit modulation section produces, as the modulation bit, a fluctuating value that takes "1" when the lower one bit of the m-bit digital control signal takes "1" twice.

13. The signal processing device of claim 8, wherein the bit modulation section produces the modulation bit in synchronization with a second operating clock that is faster than a first operating clock, the first operating clock being an operating clock of the D/A conversion section.

14. The signal processing device of claim 8, wherein the analog filter changes a cut-off frequency for the analog control signal according to an operating clock of the signal processing device.

15. A D/A converter, comprising:
a bit modulation section for modulating an m-bit (m is a positive integer) digital signal into n-bit (n is a positive integer: n<m) intermediate digital signal whose temporal average precision is substantially the same as a precision of the m-bit digital signal;

a D/A conversion section for converting the n-bit intermediate digital signal into an intermediate analog signal having a range corresponding to m bits; and an analog filter for smoothing the intermediate analog signal so as to output the smoothed signal as an analog signal whose precision is substantially the same as that of the m-bit digital signal.

16. The D/A converter of claim 15, wherein the bit modulation section produces, from lower (m−n) bit/bits of the m-bit digital signal, a 1-bit modulation bit whose temporal average precision is substantially the same as an (m−n)-bit precision so as to produce the n-bit intermediate digital signal by adding together upper n bit/bits of the m-bit digital signal and the modulation bit.

17. The D/A converter of claim 16, wherein:
the m-bit digital signal is modulated so that a temporal average precision thereof is substantially higher than m bits; and
the bit modulation section produces the modulation bit so that the temporal average precision of the modulation bit and a temporal average precision of the lower (m−n) bit/bits of the m-bit digital signal are substantially the same.

18. A D/A converter, comprising:
a bit modulation section for producing, from lower (m−n) bit/bits (m and n are each a positive integer: n<m) of an m-bit digital signal, a 1-bit modulation bit whose temporal average precision is substantially the same as an (m−n)-bit precision;

a D/A conversion section for converting upper n bit/bits of the m-bit digital signal into a first intermediate analog signal having a range corresponding to m bits;

a power supply section, which is capable of outputting an analog value corresponding to one bit in the D/A conversion section, and which outputs a second intermediate analog signal in response to the modulation bit as a switching signal;

an adder for adding together the first and second intermediate analog signals; and an analog filter for smoothing an output from the adder so as to output the smoothed signal as an analog signal whose precision is substantially the same as that of the m-bit digital signal.

19. The D/A converter of claim 18, wherein:
the m-bit digital signal is modulated so that a temporal average precision thereof is substantially higher than m bits; and
the bit modulation section produces the modulation bit so that the temporal average precision of the modulation bit and a temporal average precision of the lower (m−n) bit/bits of the m-bit digital signal are substantially the same.

* * * * *

UNITED STATES PATENT AND TRADEMARK OFFICE
CERTIFICATE OF CORRECTION

PATENT NO. : 6,747,586 B2
DATED : June 8, 2004
INVENTOR(S) : Kouji Okamoto

It is certified that error appears in the above-identified patent and that said Letters Patent is hereby corrected as shown below:

<u>Column 12,</u>
Line 36, change "2(m-n)" to -- $2^{(m-n)}$ --
Line 44, change ""o"" to -- "0" --

Signed and Sealed this

Fifteenth Day of February, 2005

JON W. DUDAS
*Director of the United States Patent and Trademark Office*